United States Patent [19]

Campbell et al.

[11] 4,385,645
[45] May 31, 1983

[54] METHOD FOR USE IN MAKING A SELECTIVELY VAPOR DEPOSITION COATED TUBULAR ARTICLE, AND PRODUCT MADE THEREBY

[75] Inventors: Bruce D. Campbell, Portola Valley; Lynn O. Chapman, Atherton, both of Calif.

[73] Assignee: Raychem Corporation, Menlo Park, Calif.

[21] Appl. No.: 395,226

[22] Filed: Jul. 6, 1982

Related U.S. Application Data

[62] Division of Ser. No. 247,042, Mar. 24, 1981, Pat. No. 4,354,456.

[51] Int. Cl.³ .................................................. F16L 11/00
[52] U.S. Cl. .................................. 138/139; 138/99; 138/143; 138/145; 138/178; 174/DIG. 8; 427/39; 427/50; 427/107; 427/124; 427/125; 427/237; 427/238; 427/282; 427/300; 427/307
[58] Field of Search .................. 138/139, 99, 143, 145, 138/178; 174/DIG. 8; 427/39, 50, 107, 124, 125, 237, 238, 282, 300, 307

[56] References Cited
U.S. PATENT DOCUMENTS 2,891,880  6/1939  Nakken ............................. 117/212
2,953,483  9/1960  Torok ............................... 117/212
3,565,644  2/1971  Al ..................................... 117/18
3,699,917  10/1972 Deverse ............................ 118/49
3,898,389  8/1975  Clabburn .......................... 174/36

Primary Examiner—Bernard D. Pianalto
Attorney, Agent, or Firm—Douglas A. Chaikin; Herbert G. Burkard

[57] ABSTRACT

An apparatus for use in selectively coating all or a portion of the interior surface of a tubular article, the apparatus including a plurality of axially spaced apart masks adapted to fit within the tubular article, support structure spacing apart the masks, and an electrically conductive coating means between the masks. The coating means may be electrically activated to spray the unmasked portion of the inside surface of the tubular article.

The apparatus is useful in making tubular articles which are coated on their interior surfaces at selective locations. An alternative embodiment of the apparatus includes masks which have been chamfered. When this alternative apparatus is used to coat the interior surface of the interconnect, a non-uniform coating is delivered to the ends of the area which are coated. Using this alternative apparatus, a stress graded coating may be applied to the selectively coated interior surface.

6 Claims, 5 Drawing Figures

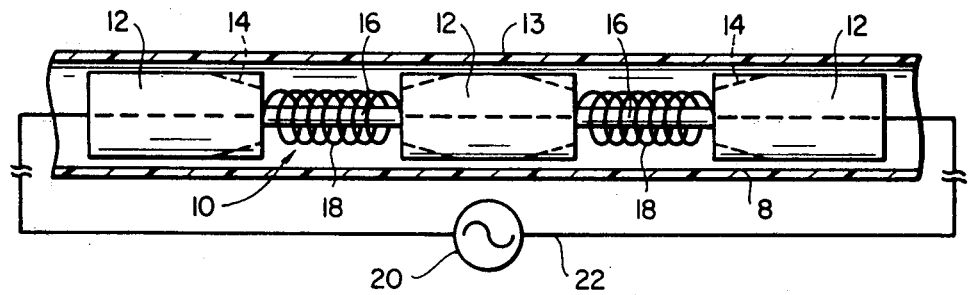
FIG_1
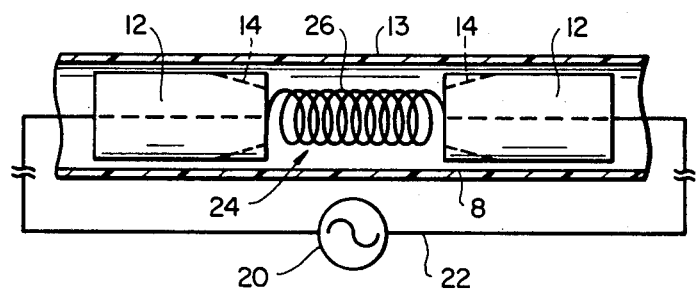
FIG_2
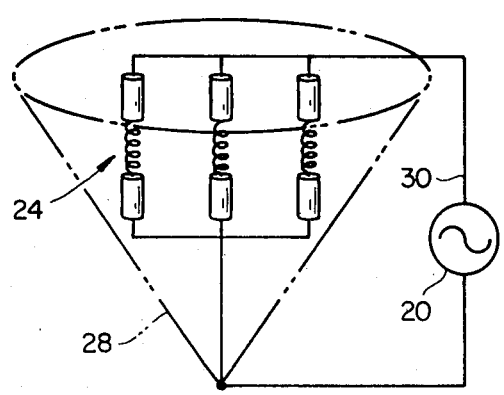
FIG_3
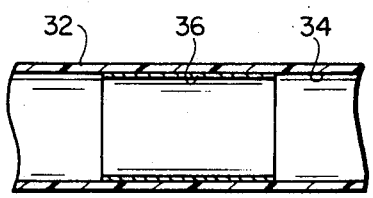
FIG_4
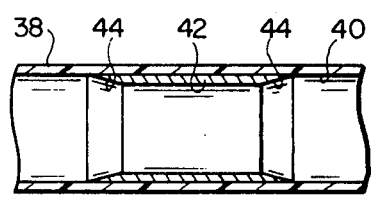
FIG_5

METHOD FOR USE IN MAKING A SELECTIVELY VAPOR DEPOSITION COATED TUBULAR ARTICLE, AND PRODUCT MADE THEREBY

This application is a division of application Ser. No. 247,042, filed Mar. 24, 1981, now U.S. Pat. No. 4,354,456.

BACKGROUND OF THE INVENTION

DISCUSSION OF PERTINENT PRIOR DISCLOSURES

Interconnect sleeves for electrical connection have long been known and used. An example of an electrical interconnect is R. J. T. Clabburn, U.S. Pat. No. 3,898,389, which discloses an electrical interconnect device, the surface of which has been coated with a thin metallic layer.

As the popularity for electrical interconnect sleeves has increased so has the need for low cost interconnect sleeves. Applicants herein have developed a method and an apparatus for use in making a low cost interconnect sleeve having a electrically conductive coating which is tenaciously bonded to the interior surface of same.

In the past there have been many methods and apparatuses for applying conductive coatings to selected areas of articles. For example, J. J. Torok, U.S. Pat. No. 2,953,483 generally discloses a method and apparatus for vapor deposition coating the surface of an article by confining the article within a chamber, vaporizing the coating and electrically charging the coating and spraying the article with the coating on the unmasked portions. Torok uses a hood for application to the surface of the article. Torok relies upon direct contact of the mask with the article to effect his coating.

Another method and apparatus for vapor deposition coatings is found in Deverse et al, U.S. Pat. No. 3,699,917 wherein solder is deposited onto the terminals of semi-conductor wafers by heating and evaporating solder on a single source. The solder is applied by a plurality of wire rings arranged in a plurality of wafer carrying tiers by exposing the evaporant approximately one-sixth (1/6) of each cycle and then cooling the solder by radiation. Trim tabs between the source and dome assure uniform distribution of solder on all wafers, regardless of tier location. Thus, the solder source rotates applying a uniform distribution (coating) of solder to the wafer (article).

Another method for selectively coating articles is found in R. J. Al, U.S. Pat. No. 3,565,644 wherein selected portions of an article are masked and then fusing pulverulent particles to the surface of the article which are applied by a powder coating method. The article is exposed to elevated temperatures for a prolonged period of time to thermally fuse the coating in place. One embodiment, shown in FIG. 3, illustrates coating a pipe fitting with a powder coating. The fittings are connected by tandem by nipples having chamfered ends, flat sheets of cork are cut to size and wrapped around each nipple and secured thereto by means of adhesive or a wire wrapped around each sheet covering the exterior surface of the nipples. The exterior surface of the fittings are coated with pulverulent coating particles after elevating the temperature.

Nakken, U.S. Pat. No. 2,891,880 discloses a vacuum deposition process for producing film resistors. A helical resistance ribbon is applied to the surface of a tubular insulating material by use of a bimetallic helical mask wherein different co-efficients of expansion of the metals are used to hold the mask onto the insulator. It will be noticed that the interior walls are necessarily in contact at all times with the mask. This method of producing resistor rings is particularly dependent upon the precise contact of the tubular article with the mask. In this manner, the coatings applied to the tubular article are the precise thickness required.

Although it has long been known to apply coatings to an article through a vapor deposition process as illustrated by the above, no one heretofore has discovered a method and apparatus for selectively coating the interior surface of tubular interconnect articles. Applicants here, have developed a novel method and apparatus which may be utilized in making cost efficient, selectively coated tubular interconnect articles as set forth above and as will be appreciated more fully hereinafter.

DESCRIPTION OF THE INVENTION

SUMMARY OF THE INVENTION

An apparatus for use in selectively vapor deposition coating the interior surface of a tubular article having a longitudinal axis. The apparatus comprises a pair of axially aligned spaced apart electrically insulated masks having opposed masking surfaces; each masking surface being generally planar and generally perpendicular to the longitudinal axis of the tubular article. The periphery of the masks are complimentary with the tubular article. Support means may be used to axially align and space apart the masks. The apparatus includes a vapor deposition coating means for applying an electrically conductive coating on the interior surface of the tubular article. The coating means may be connected to the opposed surfaces of the masks and positioned axially therebetween. Alternatively, the coating means may be wound around the support means. In an alternative embodiment of the apparatus, the masks may be modified so that a non-uniform coating may be deposited on the interior surface of the article.

A method for vapor deposition coating a selected area of the interior of a tubular article which may be corona pre-treated. The steps comprise: providing a tubular article having a longitudinal axis; inserting masks and vapor deposition coating means within the article, the masks having opposed axially aligned spaced apart planar surfaces which are generally perpendicular to the longitudinal axis, the coating means being disposed axially between the opposed surfaces; evacuating the interior of the article between the masks; and activating the coating means to deposit, in a radial fashion, a generally uniform coating on the selected area between the opposed masking surfaces.

It will be appreciated that an article made by the above described method using either of the planar mask or modified mask as will be more fully described hereinafter is also part of the applicants' invention.

OBJECTS OF THIS INVENTION

It is the primary object of this invention to provide method and apparatus for making cost efficient selectively coated tubular articles.

It is another object of this invention to provide method and apparatus for making selectively coated tubular interconnect articles having a uniform coating.

It is another object of this invention to provide method and apparatus for making selectively coated tubular interconnect articles having a non-uniform coating.

It is a further object of this invention to provide method and apparatus for making selectively coated heat recoverable tubular articles wherein the coating adheres tenaciously to the interior surface before and after recovery.

BRIEF SUMMARY OF THE DRAWING

FIG. 1 is a schematic representation of the apparatus in accordance with the present invention inserted in a tubular article and connected to a power source.

FIG. 2 is a schematic representation of an alternative apparatus in accordance with the present invention inserted in a tubular article and connected to a power source.

FIG. 3 is a schematic representation illustrating the apparatus in accordance with the present invention placed in a vacuum chamber in preparation for coating tubular articles by vapor deposition.

FIG. 4 illustrates a tubular article having a uniform coating.

FIG. 5 illustrates a tubular article having a non-uniform coating.

DETAILED DESCRIPTION OF THE INVENTION

With reference to the drawings, wherein like reference characters designate like or corresponding parts throughout the several views and referring particularly to FIG. 1, there is shown an apparatus in accordance with this invention generally designated by the numeral 10 for use in selectively coating tubular articles.

The apparatus 10, includes a plurality of axially aligned, spaced apart masks 12. The masks are electrically insulated to prevent electrical discontinuity during the coating of the article. The masks are preferably cylindrical. However, as long as the masks are complimentary with the tubular article, any shape is satisfactory, e.g. if the tubular article is rectangular, the masks should be rectangular.

In an alternative embodiment, the masks may be made of a machinable insulating material, wherein at least one of the masks include a peripheral zone which is machined along dotted lines 14, as shown in FIGS. 1 and 2. When the masks are machined in this manner, a non-uniform coating may be deposited on the tubular article 13, as shown in FIG. 5 and as will be more fully appreciated hereinafter. Applicants have found machinable porcelain or other ceramic materials to be especially well-suited for this purpose.

In the embodiment of the apparatus 10 shown in FIG. 1, a vapor deposition coating means 18 is located between the masks 14 and wound about the internal support means 16. Applicants have found that a suitable coating means comprises an electrically conductive wire, such as a tungsten wire, coated (or wicked) with an evaporant such as silver, gold, copper, aluminum or the like. Further, applicants suggest using a relatively thin coating of evaporant. Particularly, applicants have found that an evaporant coating of 1000 °A is suitable for the purposes and objects of his invention as will be more fully appreciated hereinafter.

It will be appreciated that a support means is not necessarily needed as long as the masks are axially aligned and spaced apart. Alternatively, the apparatus may include external support means (not shown) for spacing apart, axially aligning and supporting the masks when held in a vertical position as shown in FIG. 3.

Applicants, preferably, helically wind the wire having the evaporant between the masks so that a relatively uniform distribution of evaporant is sprayed onto the interior surface of the tubular article between masks 12. Of course, it may not always be desirable for the tubular article to have a relatively uniform coating. In those circumstances the mask may be machined at the peripheral zone as shown by the dotted lines 14 to define a frustoconical or truncated paraboloid shape. The resultant masking surface 12 causes an uneven (or non-uniform) coating to be applied to the adjacent interior surface of the tubular article as shown and explained more fully by FIG. 5 and the accompanying description.

The above described spraying process is known as vapor deposition. The conductive wire is wicked with evaporant and charged with a high electrical current (usually between 20–80 amps at 12 volts). The evaporant flashes from the wire to the unmasked area of the interior surface of the tubular article. As can be seen in the figures, the coating means is connected to a power supply 20 by electrically conductive conduit means 22. Tungsten wire is particularly suitable as the wire structure of the coating means because it is able to withstand high current. However, other suitable wire structures are of course known, for example nichrome wire.

FIG. 2 shows an alternative embodiment of the apparatus in accordance with this invention generally designated by the numeral 24, which includes masks 14 and a wire structure 26 between the masks. The wire structure 26, serves the dual function of spacing apart the masks and as a vapor deposition coating means defining an integral support and coating means. In this embodiment, the wire should be of a relatively heavy gauge. Applicant has found tungsten wire having a diameter between 0.010 to 0.050 inches is preferable.

Additionally, it is possible to utilize wire, such as tungsten, with three relatively thin strands wrapped together for the integral support and coating means embodiment. The wire is preferably helically wound to generate the same type of generally uniform spraying (flashing) as described previously. Structure 26 functions in a manner similar to the previously discussed coating means 18 and is shown similarly connected to a power source 20 through electrically conductive conduit means 22.

With particular reference to FIG. 3, there is shown a plurality of apparatus 24 inside a vacuum chamber 28. The apparatus 24 are connected in parallel to power source 20 by electrically conductive conduit means 30. It will, of course, be appreciated that apparatus 10 could similarly be placed inside vacuum chamber 28. Tubular articles, such as 13 may be placed over each apparatus 10 or 24, respectively, prior to placement in the vacuum chamber. The vacuum chamber 28 may then be sealed and activated. The chamber is pumped until atmospheric conditions inside the chamber reach at least $1 \times 10^{-5}$ torr. The power source may then be activated, preferably between 20–80 amps at 12 volts. The evaporant flashes to the tubular article 13. The vacuum may then be de-activated and the apparatus with the selectively coated tubular articles unloaded.

With particular reference to FIGS. 4 and 5, there is shown selectively coated tubular articles 32 and 38. In FIG. 4 there is seen tubular article 32 having an interior surface 34 which has been coated with an evaporant 36 through method described above. It will be appreciated that mask 14 need not be in contact with interior wall 34 to yield a selective, generally uniform coating 36.

In FIG. 5 there is shown another tubular article 38 which has been coated with the apparatus having the peripheral zone machined along lines 14 as shown defining a frusto-conical or truncated paraboloid shape, depending upon the type of mask used. As can be seen interior wall 40 of the tubular article 38 includes a non-uniform, progressively thinning coating wherein the central portion of the coating 42 is uniform and generally thicker than the progressively thinning outer portion 44.

It will of course be appreciated that the tubular article may be used as a heat-recoverable interconnect device. In said case, the tubular article should be made of a heat-recoverable material wherein substrates may be placed inside the article, and heat applied to form a conductive interconnect joint. The friction of the substrates against the interior coated surface of the article tends to wear off the coating. In order to minimize this effect, applicants have found a means for tenaciously bonding the coating to the interior of the tubular article.

The article 13 may be exposed to corona discharge treatment which encourages micropitting immediately prior to coating. When the interior of the tubular article 13 is micropitted, the surface area exposed to the spray is increased and irregular, thereby providing a better surface for adhering the coating to the interior of the tubular article. Moderate levels of corona pre-treatment sufficient to cause micropitting without creating undue electrical charge build-up are preferred. Additionally, when the article is placed in the vacuum chamber and the pressure lowered to the preferred condition, further micro-pitting is encouraged. Additionally, the interior of the tubular article 13 is cleaned during the vacuum process before coating.

The machining of the masks together with the ability to selectively coat without the need for direct contact of the masks to the interior surface of the tubular article allows applicant to apply the above described non-uniform coating. Thus, in addition to providing a useful apparatus for making cost effective selectively coated tubular articles, applicants provide a structure which is also useful in the making of cost effective selectively coated tubular interconnect articles wherein the coating is tenaciously bonded to the article.

It will of course be appreciated that a selectively coated tubular article may be made by the following steps: providing a tubular article having a longitudinal axis, inserting a vapor deposition coating means and masks within the article, the masks having opposed axially aligned spaced apart planar surfaces which are generally perpendicular to the longitudinal axis, the coating means is disposed axially between opposed mask surfaces; evacuating the space in the interior surface of the tubular article between the masking surface; and activating the coating means by electrical means.

Alternatively, a non-uniform coating may be deposited on the selected area of the tubular article where the masks include a peripheral zone which is non-perpendicular and outwardly diverging from the longitudinal axis of the tubular article as at lines 14. When tenacious adherence of the coating is desired, the tubular article may be pre-treated with a corona discharge under either of the above methods. Further, the article may be heat recoverable under either of the above described methods when that type of article is desired.

While the instant invention has been described by reference to what is believed to be the most practical embodiments, it is understood that the invention may embody other specific forms not departing from the spirit of the central characteristics of the invention. It should be understood that there are other embodiments which possess the qualities and characteristics which would generally function in the same manner and should be considered within the scope of this invention. The present embodiments therefore should be considered in all respects as illustrative and not restrictive, the scope of the invention being limited solely to the appended claims rather than the foregoing description and all equivalents thereto being intended to be embraced therein.

What is claimed is:

1. A method for vapor deposition coating a selected area of the interior of a tubular article, the steps comprising:
   providing a tubular article having a longitudinal axis;
   inserting vapor deposition coating means and masks within the article, the masks having opposed axially aligned spaced apart planar masking surfaces which are generally perpendicular to the longitudinal axis, the vapor deposition coating means being disposed axially between the opposed surfaces;
   evacuating area between masks to be coated; and
   activating the vapor deposition coating means to deposit, in a radial fashion, a generally uniform coating on the interior surface of article between the opposed masking surfaces.

2. An article made by the method of claim 1.

3. The method as set forth in claim 1, wherein at least one of the masking means opposed surfaces include an outer annular zone which is non-perpendicular and outwardly diverging from the longitudinal axis for depositing a non-uniform coating on the selected area of the tubular article.

4. An article made by the method of claim 3.

5. The method as set forth in claim 3 or claim 1, further including pre-treating the interior of the tubular article with corona discharge to encourage micropitting after providing and before inserting.

6. An article made by the method of claim 5.

* * * * *